(12) United States Patent
Liu

(10) Patent No.: US 12,519,443 B2
(45) Date of Patent: Jan. 6, 2026

(54) BULK ACOUSTIC WAVE RESONANCE DEVICE AND BULK ACOUSTIC WAVE FILTER

(71) Applicant: CHANGZHOU CHEMSEMI CO., LTD., Changzhou (CN)

(72) Inventor: Yuhao Liu, Shanghai (CN)

(73) Assignee: CHANGZHOU CHEMSEMI CO., LTD., Changzhou (CN)

( * ) Notice: Subject to any disclaimer, the term of this patent is extended or adjusted under 35 U.S.C. 154(b) by 979 days.

(21) Appl. No.: 17/640,355

(22) PCT Filed: Sep. 5, 2019

(86) PCT No.: PCT/CN2019/104599
§ 371 (c)(1),
(2) Date: Mar. 4, 2022

(87) PCT Pub. No.: WO2021/042342
PCT Pub. Date: Mar. 11, 2021

(65) Prior Publication Data
US 2022/0337212 A1 Oct. 20, 2022

(51) Int. Cl.
*H03H 9/17* (2006.01)
*H03H 3/02* (2006.01)
(Continued)

(52) U.S. Cl.
CPC .......... *H03H 3/02* (2013.01); *H03H 9/02015* (2013.01); *H03H 9/173* (2013.01); *H03H 9/54* (2013.01)

(58) Field of Classification Search
CPC ................ H03H 9/02015; H03H 9/173
See application file for complete search history.

(56) References Cited

U.S. PATENT DOCUMENTS 8,330,556 B2    12/2012  Miller et al.
2007/0200458 A1  8/2007  Yoshino et al.
(Continued)

FOREIGN PATENT DOCUMENTS

CN    101026366 A    8/2007
CN    103296992 A    9/2013
(Continued)

OTHER PUBLICATIONS

European Patent Office, the Partial Supplementary European Search Report Issued in Application No. 19944132.0, May 8, 2023, Germany, 12 pages.
(Continued)

*Primary Examiner* — Bryan P Gordon
(74) *Attorney, Agent, or Firm* — Kilpatrick Townsend & Stockton LLP

(57) ABSTRACT

The present disclosure provides a bulk acoustic wave resonance device, a bulk acoustic wave filter device and a radio frequency front end device. The bulk acoustic wave resonance device includes: a first layer including a first cavity disposed at a first side of the first layer; a first electrode layer, and a first end of the first electrode layer is in contact with the first layer, and a second end of the first electrode layer is disposed within the first cavity; a second layer disposed at the first side and disposed on the first electrode layer, and the second layer is a flat layer and covers the first cavity; and a second electrode layer disposed at the first side and disposed on the second layer, and a first portion of the first electrode layer overlapping with the second electrode layer is disposed within the first cavity.

36 Claims, 8 Drawing Sheets

(51) Int. Cl.
*H03H 9/02* (2006.01)
*H03H 9/54* (2006.01)

(56) References Cited

U.S. PATENT DOCUMENTS

| | | | |
|---|---|---|---|
| 2007/0210878 A1* | 9/2007 | Yamaguchi | H03H 9/132 |
| | | | 333/187 |
| 2009/0295506 A1 | 12/2009 | Handtmann et al. | |
| 2011/0132866 A1 | 6/2011 | Pijolat | |
| 2012/0205754 A1 | 8/2012 | Iwamoto | |
| 2015/0014795 A1 | 1/2015 | Franosch et al. | |
| 2018/0006631 A1* | 1/2018 | Kida | H03H 9/205 |
| 2018/0041189 A1 | 2/2018 | Lee et al. | |
| 2018/0054176 A1* | 2/2018 | Kim | H10N 30/706 |
| 2018/0123558 A1* | 5/2018 | Ivira | H03H 9/175 |
| 2018/0309428 A1* | 10/2018 | Lim | H03H 9/173 |
| 2019/0020328 A1* | 1/2019 | Shealy | H03H 9/545 |
| 2019/0149127 A1* | 5/2019 | Lee | H03H 9/54 |
| | | | 333/190 |
| 2021/0091742 A1 | 3/2021 | Gorisse et al. | |
| 2021/0399713 A1* | 12/2021 | Yu | H03F 3/21 |
| 2022/0149803 A1 | 5/2022 | Shuai et al. | |

FOREIGN PATENT DOCUMENTS

| | | |
|---|---|---|
| CN | 105897211 A | 8/2016 |
| CN | 107222181 A | 9/2017 |
| CN | 107623502 A | 1/2018 |
| CN | 107689781 A | 2/2018 |
| CN | 108736856 A | 11/2018 |
| CN | 109802648 A | 5/2019 |
| CN | 109981070 A | 7/2019 |
| JP | 2006186412 A | 7/2006 |
| WO | 2019129979 A1 | 7/2019 |

OTHER PUBLICATIONS

State Intellectual Property Office of the People's Republic of China, Office Action and Search Report Issued in Application No. 201980098451.4, Apr. 18, 2024, 17 pages.
European Patent Office, Extended European Search Report Issued in Application No. 19944132.0, Sep. 14, 2023, Germany, 16 pages.

* cited by examiner

BULK ACOUSTIC WAVE RESONANCE DEVICE AND BULK ACOUSTIC WAVE FILTER

CROSS-REFERENCE TO RELATED APPLICATIONS

This application is the national phase of International Application No. PCT/CN2019/104599, filed on Sep. 5, 2019, the entire disclosures of which are incorporated herein by reference.

FIELD

The present disclosure relates to the field of semiconductors, and in particular to a bulk acoustic wave resonance device, a bulk acoustic wave filter device and a radio frequency front end device.

BACKGROUND

A Radio Frequency (RF) front-end chip of a wireless communication device includes a power amplifier, an antenna switch, a radio frequency filter, a duplexer, a multiplexer and a low noise amplifier, etc., and the radio frequency filter includes a Surface Acoustic Wave (SAW) filter, a Bulk Acoustic Wave (BAW) filter, a Micro-Electro-Mechanical System (MEMS) filter, and an Integrated Passive Device (IPD) filter, etc. As both a SAW resonator and a BAW resonator have a high quality value (Q value), a radio frequency filter including a SAW resonator, namely a SAW filter, and that including a BAW resonator, namely a BAW filter, have low insertion loss and high out-of-band rejection, and thus become current mainstream radio frequency filters used by wireless communication devices such as mobile phones and base stations. The Q value is a quality factor value of a resonator, and is defined by a center frequency divided by 3 dB bandwidth of the resonator. An application frequency of the SAW filter is generally from 0.4 GHz to 2.7 GHz and an application frequency of the BAW filter is generally from 0.7 GHz to 7 GHz.

Compared with a SAW resonator, a BAW resonator has better performance, but the manufacturing cost of the BAW resonator is higher than that of the SAW resonator due to more complicated process. However, as wireless communication technology gradually evolves, more and more frequency bands are used. Moreover, with the application of frequency band superposition technology such as carrier aggregation, mutual interference between wireless frequency bands becomes more and more serious. High performance BAW technology can solve the problem of mutual interference. With the advent of 5G era, wireless mobile networks have adopted higher frequency bands, and currently, only BAW technology can solve the filtering problem at high frequency.

FIG. 1a illustrates a BAW filter circuit including a ladder circuit consisting of BAW resonators, and f1, f2, f3 and f4 represent four different frequencies, respectively. Within each BAW resonator, alternating voltages with different polarities are supplied to metal electrodes on both sides of a piezoelectric layer of the resonator, an acoustic wave is generated by the piezoelectric layer under the alternating voltages with different polarities, and the acoustic wave within the resonator propagates in a direction perpendicular to the piezoelectric layer. In order to form resonance, the acoustic wave requires total reflection on an upper surface of an upper metal electrode and on a lower surface of a lower metal electrode to form a standing acoustic wave. A condition for an acoustic wave reflection is that acoustic impedance of medium in contact with the upper surface of the upper metal electrode and the lower surface of the lower metal electrode is greatly different from that of a metal electrode.

A Film Bulk Acoustic Wave Resonator (FBAR) is a kind of BAW resonator which can restrain acoustic wave energy inside the resonator. There is air or vacuum above a resonance region of the BAW resonator, and there is a cavity below the resonance region of the BAW resonator. Because the acoustic impedance of air is very different from that of metal electrodes, acoustic waves can be totally reflected on an upper surface of an upper metal electrode and a lower surface of a lower metal electrode to form a standing wave.

FIG. 1b illustrates a schematic structural view of a cross-section A of an FBAR 100. The FBAR 100 includes a substrate 101, an electrode layer 105, a piezoelectric layer 107 and an electrode layer 109. The substrate 101 includes a cavity 103 embedded at an upper surface of the substrate 101. The electrode layer 105 is disposed on the substrate 101 and the cavity 103. The piezoelectric layer 107 is disposed on the substrate 101 and covers the electrode layer 105. The piezoelectric layer 107 includes a convex part 107a. The electrode layer 109 is disposed on the piezoelectric layer 107 and includes a convex part 109a, and the convex part 109a is disposed on the convex part 107a. A resonance region 111 (i.e., an overlap region of the electrode layer 105 and the convex part 109a) is disposed above the cavity 103, where the resonance region 111 not only overlaps with but also touches the substrate 101. If the acoustic impedance of the substrate 101 closes to that of the piezoelectric layer 107, the energy of the resonance region 111 spreads to the non-resonance region in a direction indicated by an arrow 113 and propagates into the substrate 101, which may cause a decrease of the Q value of the resonator. In addition, since the electrode layer 105 protrudes above the substrate 101, forming the piezoelectric layer 107 directly on the electrode layer 105 and the substrate 101 may cause some crystal grains in the piezoelectric layer 107, for example, some crystal grains in both side portions 115 of the convex part 107a, to suffer from a significant change to their orientation and to be not parallel to other crystal grains, for example, some crystal grains in a middle portion 117 of the convex part 107a, which may cause a decrease of electromechanical coupling factor and Q value of the FBAR.

SUMMARY

The present disclosure is to provide a bulk acoustic wave resonance device and a bulk acoustic wave filter, and a resonance region of the bulk acoustic wave resonance device is suspended relative to a cavity in an intermediate layer or a support layer or a substrate, so as to increase the difference between the acoustic impedance of the resonance region and that of a non-resonance region, thereby increasing Q value of the resonance device. In addition, a piezoelectric layer of the bulk acoustic wave resonance device does not include crystal grains which suffer from a significant change to their orientation, thereby increasing an electromechanical coupling factor of the resonance device and the Q value of the resonance device.

To this end, embodiments of the present disclosure provide a bulk acoustic wave resonance device, including: a first layer including a first cavity disposed at a first side of the first layer; a first electrode layer, and a first end of the first electrode layer is in contact with the first layer, and a second end of the first electrode layer is disposed within the first cavity; a second layer disposed at the first side and disposed on the first electrode layer, and the second layer is a flat layer and covers the first cavity; and a second electrode layer disposed at the first side and disposed on the second layer, and a first portion of the first electrode layer overlapping with the second electrode layer is disposed within the first cavity.

It should be noted that by adjusting positions of the first electrode layer and the second electrode layer so that a resonance region, that is an overlap region by the first electrode and the second electrode, neither overlaps with nor is in contact with the first layer, and the resonance region is suspended relative to the first cavity, difference between the acoustic impedance of the resonance region and that of a non-resonance region can be increased, thereby increasing the Q value of the resonance device.

In some embodiments, the first layer further includes an intermediate layer, and the intermediate layer includes the first cavity. In some embodiments, the intermediate layer is made of one or more materials selected from a group consisting of polymer and insulating dielectric. In some embodiments, the polymer includes at least one selected from a group consisting of benzocyclobutene (i.e., BCB), photosensitive epoxy resin photoresist (e.g., SU-8), and polyimide. In some embodiments, the insulating dielectric includes at least one selected from a group consisting of aluminum nitride, silicon dioxide, silicon nitride, and titanium oxide. In some embodiments, the intermediate layer has a thickness ranging from 0.1 micrometer to 10 micrometers.

In some embodiments, the first layer further includes a support layer, and the support layer includes the first cavity. In some embodiments, the support layer is made of one or more materials selected from a group consisting of polymer and insulating dielectric. In some embodiments, the polymer includes at least one selected from a group consisting of benzocyclobutene (i.e., BCB), photosensitive epoxy resin photoresist (e.g., SU-8), and polyimide. In some embodiments, the insulating dielectric includes at least one selected from a group consisting of aluminum nitride, silicon dioxide, silicon nitride, and titanium oxide. In some embodiments, the support layer has a thickness ranging from 20 micrometers to 100 micrometers.

In some embodiments, the first layer further includes a first substrate, and the first substrate includes the first cavity. In some embodiments, the first substrate is made of one or more materials selected from a group consisting of silicon, silicon carbide and glass.

In some embodiments, the first layer further includes an etch shield layer covering at least a bottom or a side wall of the first cavity. In some embodiments, the etch shield layer is made of one or more materials selected from a group consisting of aluminum nitride, silicon carbide, diamond, silicon nitride, silicon dioxide, aluminum oxide and titanium dioxide. In some embodiments, the etch shield layer has a thickness ranging from 0.1 micrometer to 3 micrometers. In some embodiments, the etch shield layer has a thickness ranging from 2 micrometers to 6 micrometers. It should be noted that the etch shield layer may serve to protect the intermediate layer or the support layer or the first substrate when forming the first cavity by etch. In addition, the etch shield layer may protect the resonance device from being corroded by water or oxygen.

In some embodiments, the first layer further includes a first groove disposed at the first side. The first groove is disposed adjacent to the first cavity in a horizontal direction and communicated with the first cavity, and the first end is disposed in the first groove. It should be noted that a depth of the first groove is less than a depth of the first cavity, and the depth of the first groove at least corresponds to a thickness of the first electrode layer (for example, the depth of the first groove is equal to the thickness of the first electrode layer or the sum of the thickness of the first electrode layer and a thickness of the etch shield layer).

In some embodiments, the second layer includes a piezoelectric layer, and the piezoelectric layer includes crystal grains. Crystal grains include a first crystal grain and a second crystal grain, and the first crystal grain and the second crystal grain are any two crystal grains of crystal grains. A first coordinate axis along a first direction corresponds to a height of the first crystal grain and a second coordinate axis along a second direction corresponds to a height of the second crystal grain. The first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first crystal grain corresponds to a first coordinate system including the first coordinate axis and a third coordinate axis along a third direction, and the second crystal grain corresponds to a second coordinate system including the second coordinate axis and a fourth coordinate axis along a fourth direction.

In some embodiments, the first coordinate system further includes a fifth coordinate axis along a fifth direction, and the second coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the material of the piezoelectric layer includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the second layer includes a piezoelectric layer including crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer on a plane may allow the piezoelectric layer not to include a crystal grain which suffers from a significant change to its orientation, thereby helping to increase the electromechanical coupling factor of the resonance device and the Q value of the resonance device.

In some embodiments, a second portion of the second electrode layer overlapping with the first electrode layer is disposed above the first cavity, and a projection of the second portion along a direction perpendicular to the first layer falls within the first cavity.

In some embodiments, the material of the first electrode layer includes, but is not limited to, at least one of molybdenum, ruthenium, tungsten, platinum, iridium and aluminum, and the material of the second electrode layer includes, but is not limited to, at least one of molybdenum, ruthenium, tungsten, platinum, iridium and aluminum.

In some embodiments, the first electrode layer includes a first polarity and the second electrode layer includes a second polarity. In some embodiments, the first electrode layer includes the first polarity and the second polarity, and the second electrode layer includes the first polarity and the second polarity. The first polarity is different from the second polarity. It should be noted that electrode polarities include a positive polarity and a negative polarity.

In some embodiments, the resonance device further includes a second substrate disposed at a second side of the first layer, and the second side is opposite to the first side. In some embodiments, the material of the second substrate includes, but is not limited to, at least one of silicon, silicon carbide and glass. It should be noted that acoustic impedance of the first layer may be smaller than that of the second layer so as to prevent waves propagating from the resonance region into the second substrate.

In some embodiments, the resonance device further includes a film disposed between the first layer and the second substrate. In some embodiments, the film includes, but is not limited to a polycrystalline film. In some embodiments, the material of the polycrystalline film includes, but is not limited to, at least one of polysilicon, polycrystalline silicon nitride, and polycrystalline silicon carbide. It should be noted that the film helps to prevent the formation of a free electron layer on the surface of the second substrate, thereby reducing the electrical loss caused by the second substrate.

Embodiments of the present disclosure also provide a bulk acoustic wave filter device. The bulk acoustic wave filter device includes at least one bulk acoustic wave resonance device according to any one of above embodiments of the present disclosure.

BRIEF DESCRIPTION OF THE DRAWINGS

FIG. 14 (ii) illustrates a schematic structural view of a tetragonal crystal grain; and FIG. 14 (iii) illustrates a schematic structural view of a cubic crystal grain.

DETAILED DESCRIPTION

Embodiments of the present disclosure will be described in detail below in conjunction with the accompanying drawings.

In following description, specific details are set forth in order to provide a thorough understanding of the present disclosure, but the present disclosure may be practiced otherwise than as specifically described herein, and therefore the present disclosure is not limited by the specific embodiments disclosed below.

Figure 1A:
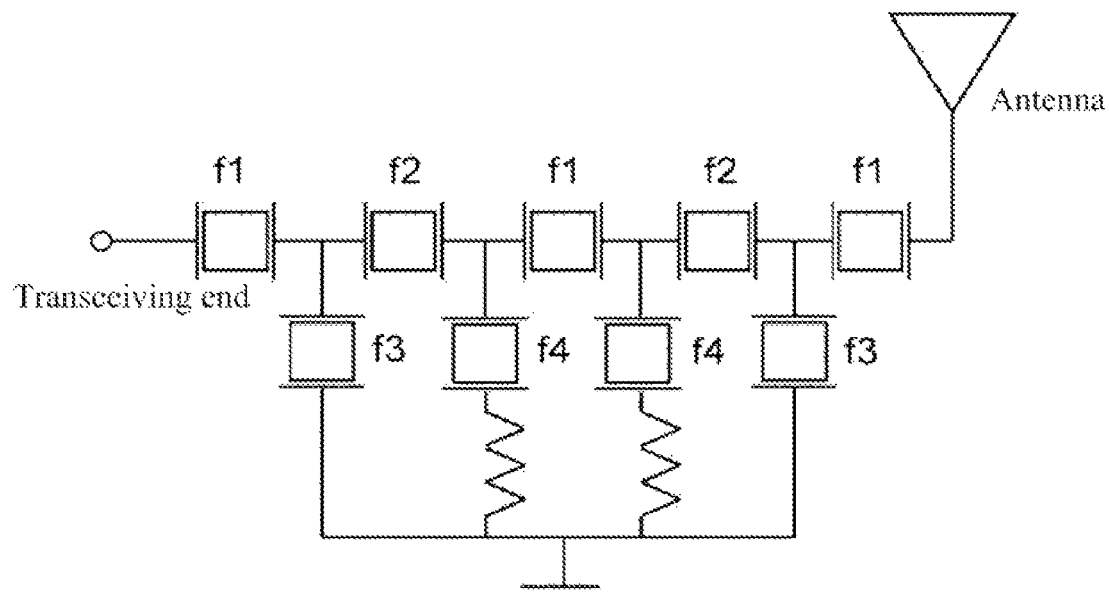
FIG. 1a illustrates a schematic view of a bulk acoustic wave filter circuit.
Figure 1B:
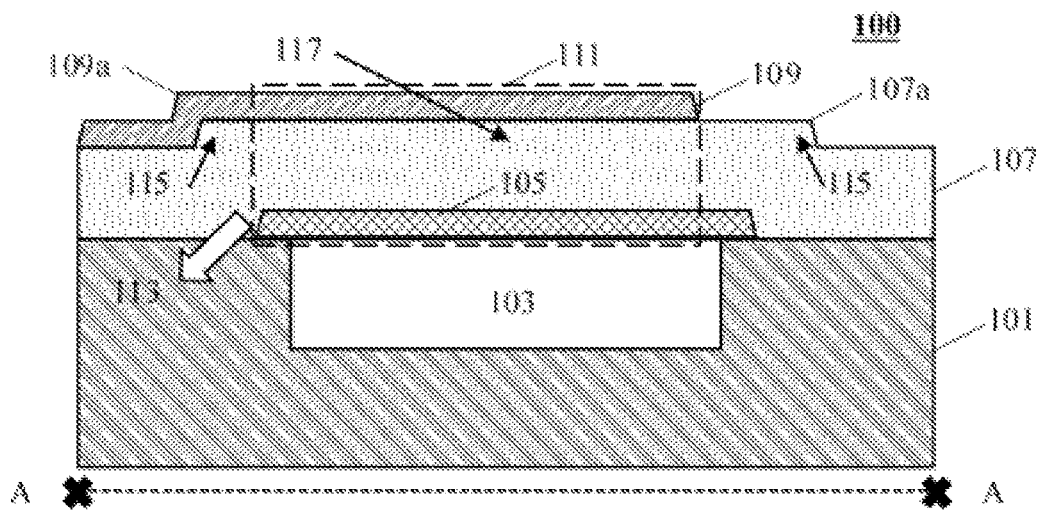
FIG. 1b illustrates a schematic structural view of a cross-section A of an FBAR 100.

As described in the background, with reference to FIG. 1B, the resonance region 111 is not suspended relative to the cavity 103, where the resonance region 111 not only overlaps with but also touches the substrate 101. If the acoustic impedance of the substrate 101 closes to the acoustic impedance of the piezoelectric layer 107, the energy of the resonance region 111 will spread to the non-resonance region and propagates into the substrate 101, thereby causing the Q value of the resonator to decrease. In addition, since the electrode layer 105 protrudes above the substrate 101, forming the piezoelectric layer 107 directly on the electrode layer 105 and the substrate 101 may cause some crystal grains in the piezoelectric layer 107 to suffer from a significant change to their orientation and thus to be not parallel to other crystal grains, thereby reducing the electromechanical coupling factor of the resonance device and the Q value of the resonance device.

It has been found that by adjusting positions of two electrode layers so that a resonance region neither overlaps with nor touches an intermediate layer or a support layer or a first substrate, and the resonance region is suspended relative to a cavity of the intermediate layer or the first substrate, difference between the acoustic impedance of the resonance region and that of a non-resonance region can be increased, thereby increasing the Q value of the resonance device.

It has also been found that by forming a piezoelectric layer on a flat surface, the piezoelectric layer does not include a crystal grain with significantly changed orientation, thereby improving the electromechanical coupling factor of the resonance device and the Q value of the resonance device.

It has also been found that by providing the intermediate layer having a relatively smaller acoustic impedance than the piezoelectric layer, waves can be prevented from propagating from the resonance region into the substrate can be reduced.

It has also been found that by providing a film between the intermediate layer and the substrate, a formation of a free electron layer on a surface of the substrate can be avoided, thereby reducing electrical loss caused by the substrate.

Embodiments of the present disclosure provide a bulk acoustic wave resonance device, including: a first layer including a first cavity disposed at a first side of the first layer; a first electrode layer, and a first end of the first electrode layer is in contact with the first layer, and a second end of the first electrode layer is disposed within the first cavity; a second layer disposed at the first side and disposed on the first electrode layer, and the second layer is a flat layer and covers the first cavity; and a second electrode layer disposed at the first side and disposed on the second layer, and a first portion of the first electrode layer overlapping with the second electrode layer is disposed within the first cavity.

It should be noted that by adjusting positions of the first electrode layer and the second electrode layer so that a resonance region, that is an overlap region by the first electrode and the second electrode, neither overlaps with nor is in contact with the first layer, and the resonance region is suspended relative to the first cavity, difference between the acoustic impedance of the resonance region and that of a non-resonance region can be increased, thereby increasing the Q value of the resonance device.

In some embodiments, the first layer further includes an intermediate layer, and the intermediate layer includes the first cavity. In some embodiments, the material of the intermediate layer includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide. In some embodiments, the thickness of the intermediate layer includes, but is not limited to 0.1 micrometer to 10 micrometers.

In some embodiments, the first layer further includes a support layer, and the support layer includes the first cavity. In some embodiments, the support layer is made of one or more materials selected from a group consisting of polymer and insulating dielectric. In some embodiments, the polymer includes at least one selected from a group consisting of benzocyclobutene (i.e., BCB), photosensitive epoxy resin photoresist (e.g., SU-8), and polyimide. In some embodiments, the insulating dielectric includes at least one selected from a group consisting of aluminum nitride, silicon dioxide, silicon nitride, and titanium oxide. In some embodiments, the support layer has a thickness ranging from 20 micrometers to 100 micrometers.

In some embodiments, the first layer further includes a first substrate, and the first substrate includes the first cavity. In some embodiments, the material of the first substrate includes, but is not limited to, at least one of silicon, silicon carbide, and glass.

In some embodiments, the first layer further includes an etch shield layer covering at least a bottom or a side wall of the first cavity. In some embodiments, the material of the etch shield layer includes, but is not limited to, at least one of aluminum nitride, silicon carbide, diamond, silicon nitride, silicon dioxide, aluminum oxide, and titanium dioxide. In some embodiments, the thickness of the etch shield layer includes, but is not limited to 0.1 micrometer to 3 micrometers. In some embodiments, the thickness of the etch shield layer includes, but is not limited to 2 micrometers to 6 micrometers.

It should be noted that the etch shield layer may serve to protect the intermediate layer or the support layer or the first substrate when forming the first cavity by etch. In addition, the etch shield layer may serve to protect the resonance device from being corroded by water or oxygen.

In some embodiments, the first layer further includes a first groove disposed at the first side. The first groove is disposed adjacent to the first cavity in a horizontal direction and communicated with the first cavity, and the first end is disposed in the first groove. It should be noted that a depth of the first groove is less than a depth of the first cavity, and the depth of the first groove at least corresponds to a thickness of the first electrode layer (for example, the depth of the first groove is equal to the thickness of the first electrode layer or the sum of the thickness of the first electrode layer and a thickness of the etch shield layer).

In some embodiments, the second layer includes a piezoelectric layer, and the piezoelectric layer includes crystal grains. Crystal grains include a first crystal grain and a second crystal grain, and the first crystal grain and the second crystal grain are any two crystal grains of crystal grains. A first coordinate axis along a first direction corresponds to a height of the first crystal grain and a second coordinate axis along a second direction corresponds to a height of the second crystal grain. The first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first crystal grain corresponds to a first coordinate system including the first coordinate axis and a third coordinate axis along a third direction, and the second crystal grain corresponds to a second coordinate system including the second coordinate axis and a fourth coordinate axis along a fourth direction.

In some embodiments, the first coordinate system further includes a fifth coordinate axis along a fifth direction, and the second coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector to along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the material of the piezoelectric layer includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the second layer includes a piezoelectric layer including crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer on a plane may allow the piezoelectric layer not to include a crystal grain which suffers from a significant change to its orientation, thereby helping to increase the electromechanical coupling factor of the resonance device and the Q value of the resonance device.

In some embodiments, a second portion of the second electrode layer overlapping with the first electrode layer is disposed above the first cavity, and a projection of the second portion along a direction perpendicular to the first layer falls within the first cavity.

In some embodiments, the material of the first electrode layer includes, but is not limited to, at least one of molybdenum, ruthenium, tungsten, platinum, iridium and aluminum, and the material of the second electrode layer includes, but is not limited to, at least one of molybdenum, ruthenium, tungsten, platinum, iridium and aluminum.

In some embodiments, the first electrode layer includes a first polarity and the second electrode layer includes a second polarity. In some embodiments, the first electrode layer includes the first polarity and the second polarity, and the second electrode layer includes the first polarity and the second polarity. The first polarity is different from the second polarity. It should be noted that electrode polarities include a positive polarity and a negative polarity.

In some embodiments, the resonance device further includes a second substrate disposed at a second side of the first layer, and the second side is opposite to the first side. In some embodiments, the material of the second substrate includes, but is not limited to, at least one of silicon, silicon carbide and glass. It should be noted that acoustic impedance of the first layer may be smaller than that of the second layer so as to prevent waves propagating from the resonance region into the second substrate.

In some embodiments, the resonance device further includes a film disposed between the first layer and the second substrate. In some embodiments, the film includes, but is not limited to a polycrystalline film. In some embodiments, the material of the polycrystalline film includes, but is not limited to, at least one of polysilicon, polycrystalline silicon nitride, and polycrystalline silicon carbide.

It should be noted that the film helps to prevent the formation of a free electron layer on the surface of the second substrate, thereby reducing the electrical loss caused by the second substrate.

Embodiments of the present disclosure further provide a bulk acoustic wave filter device including at least one bulk acoustic wave resonance device according to any one of above embodiments.

Figure 2:
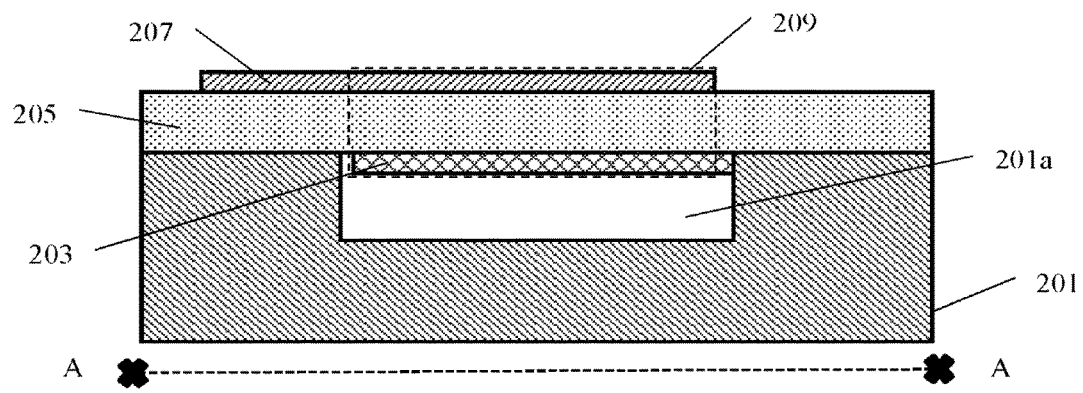
FIG. 2 illustrates a schematic structural view of a cross-section A of a bulk acoustic wave resonance device 200 according to an embodiment of the present disclosure.

FIG. 2 is a schematic structural view of a cross-section A of a bulk acoustic wave resonance device 200 according to an embodiment of the present disclosure.

As shown in FIG. 2, embodiments of the present disclosure provide a bulk acoustic wave resonance device 200. The bulk acoustic wave resonance device 200 includes a substrate 201, an electrode layer 203, a piezoelectric layer 205 and an electrode layer 207. The substrate 201 includes a cavity 201a embedded at an upper surface of the substrate 201. A first end of the electrode layer 203 is in contact with a side wall of the cavity 201a and a second end of the electrode layer 203 is disposed within the cavity 201a. The piezoelectric layer 205 is disposed on the substrate 201 and the electrode layer 203. The piezoelectric layer 205 is a flat layer and covers the cavity 201a. The electrode layer 207 is disposed on the piezoelectric layer 205. As can be seen in FIG. 2, a resonance region 209 (i.e., an overlap region of the electrode layer 203 and the electrode layer 207) is suspended relative to the cavity 201a, and neither overlaps with nor is in contact with the substrate 201. A perpendicular projection of the resonance region 209 perpendicular to the upper surface falls within the cavity 201a, which increases the difference between the acoustic impedance of the resonance region 209 and the acoustic impedance of the non-resonance region, thereby increasing the Q value of the resonance device.

In some embodiments, the material of the substrate 201 includes, but is not limited to, at least one of silicon, silicon carbide and glass.

In some embodiments, the piezoelectric layer 205 covers the upper surface of the substrate 201. In some embodiments, the material of the piezoelectric layer 205 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

Figure 13:
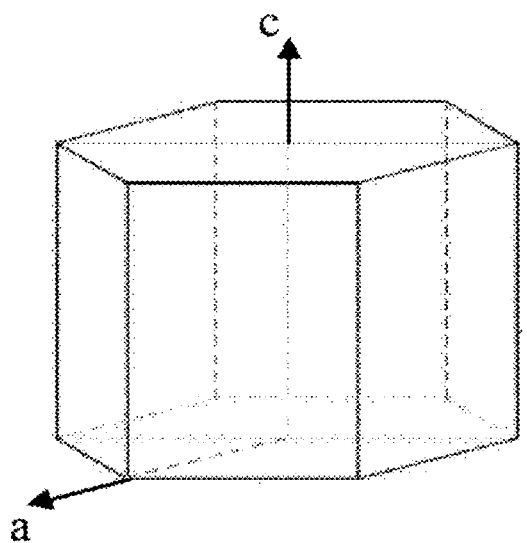
FIG. 13 illustrates a schematic structural view of a hexagonal crystal grain.
Figure 14:
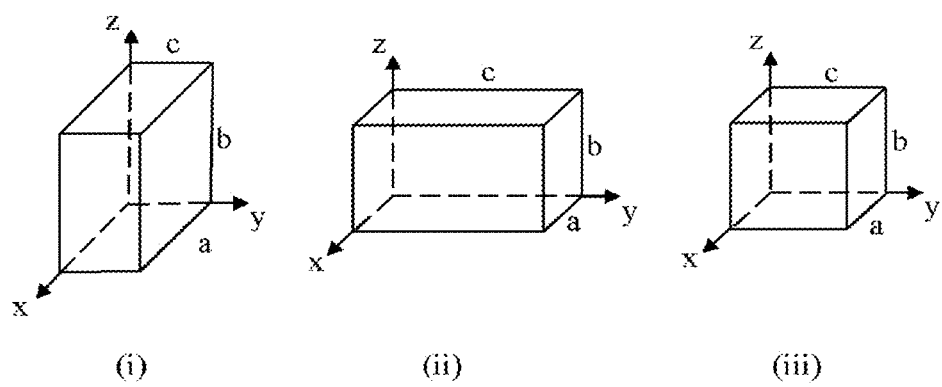
FIG. 14 (i) illustrates a schematic structural view of an orthorhombic crystal grain.

In some embodiments, the piezoelectric layer 205 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system ($a \neq b \neq c$), (ii) tetragonal system ($a = b \neq c$), (iii) cubic system ($a = b = c$), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 205 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 205 on a plane may allow the piezoelectric layer 205 not to include a crystal grain which suffers from a significant change to its orientation, thereby helping to increase the electromechanical coupling factor of the resonance device and the Q value of the resonance device.

In some embodiments, a portion of the electrode layer 203 overlapping with the electrode layer 207 is disposed within the cavity 201a, and a portion of the electrode layer 207 overlapping with the electrode layer 203 is disposed above the cavity 201a.

In some embodiments, the material of the electrode layer 203 includes, but is not limited to, at least one of molybdenum, ruthenium, tungsten, platinum, iridium and aluminum, and the material of the electrode layer 207 includes, but is not limited to, at least one of molybdenum, ruthenium, tungsten, platinum, iridium and aluminum.

In some embodiments, the electrode layer 203 includes a negative electrode and the electrode layer 207 includes a positive electrode. In some embodiments, the electrode layer 203 includes a positive electrode and the electrode layer 207 includes a negative electrode. In some embodiments, the electrode layer 203 includes a positive electrode and a negative electrode and the electrode layer 207 includes a positive electrode and a negative electrode.

Figure 3:
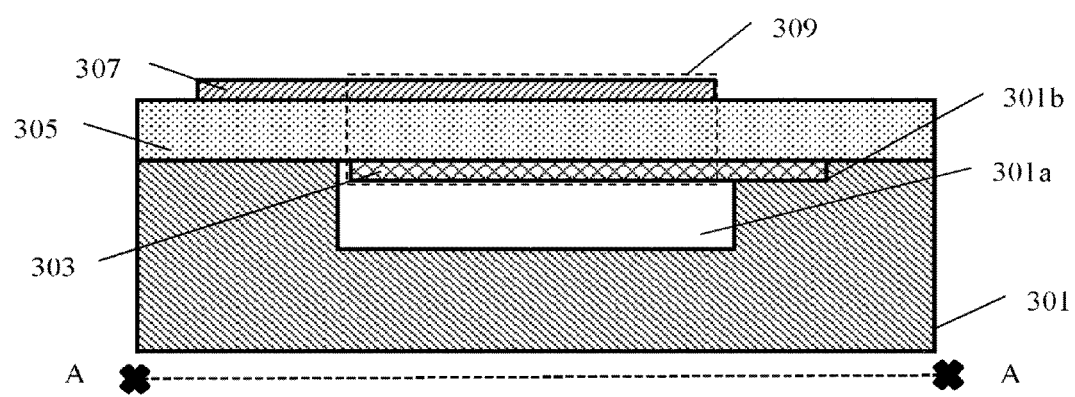
FIG. 3 illustrates a schematic structural view of a cross-section A of a bulk acoustic wave resonance device 300 according to an embodiment of the present disclosure.

FIG. 3 is a schematic structural view of a cross-section A of a bulk acoustic wave resonance device 300 according to an embodiment of the present disclosure.

As shown in FIG. 3, embodiments of the present disclosure provide a bulk acoustic wave resonance device 300. The bulk acoustic wave resonance device 300 includes a substrate 301, an electrode layer 303, a piezoelectric layer 305 and an electrode layer 307. The substrate 301 includes a cavity 301a and a groove 301b embedded at an upper surface of the substrate 301. The groove 301b is disposed adjacent to the cavity 301a in a horizontal direction and is communicated with the cavity 301a, and a depth of the groove 301b is less than a depth of the cavity 301a. A first end of the electrode layer 303 is disposed within the groove 301b, a second end of the electrode layer 303 is disposed within the cavity 301a, and a depth of the groove 301b is equal to a thickness of the electrode layer 303. The piezoelectric layer 305 is disposed on the substrate 301 and the electrode layer 303. The piezoelectric layer 305 is a flat layer and covers the cavity 301a. The electrode layer 307 is disposed on the piezoelectric layer 305. As can be seen in FIG. 3, a resonance region 309 (i.e., an overlap region of the electrode layer 303 and the electrode layer 307) is suspended relative to the cavity 301a, and neither overlaps with nor is in contact with the substrate 301. A perpendicular projection of the resonance region 309 perpendicular to the upper surface falls within the cavity 301a, which increases the difference between the acoustic impedance of the resonance region 309 and the non-resonance region, thereby increasing the Q value of the resonance device.

In some embodiments, the material of the substrate 301 includes, but is not limited to, at least one of silicon, silicon carbide, and glass.

In some embodiments, the piezoelectric layer 305 covers the upper surface of the substrate 301. In some embodiments, the material of the piezoelectric layer 305 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 305 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 305 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 305 on a plane may allow the piezoelectric layer 305 not to include a crystal grain which suffers from a significant change to its orientation, thereby helping to increase the electromechanical coupling factor of the resonance device and the Q value of the resonance device.

In some embodiments, a portion of the electrode layer 303 overlapping with the electrode layer 307 is disposed within the cavity 301a, and a portion of the electrode layer 307 overlapping with the electrode layer 303 is disposed above the cavity 301a.

In some embodiments, the material of the electrode layer 303 includes, but is not limited to, at least one of molybdenum, ruthenium, tungsten, platinum, iridium and aluminum, and the material of the electrode layer 307 includes, but is not limited to, at least one of molybdenum, ruthenium, tungsten, platinum, iridium and aluminum.

In some embodiments, the electrode layer 303 includes a negative electrode and the electrode layer 307 includes a positive electrode. In some embodiments, the electrode layer 303 includes a positive electrode and the electrode layer 307 includes a negative electrode. In some embodiments, the electrode layer 303 includes a positive electrode and a negative electrode and the electrode layer 307 includes a positive electrode and a negative electrode.

Figure 4:
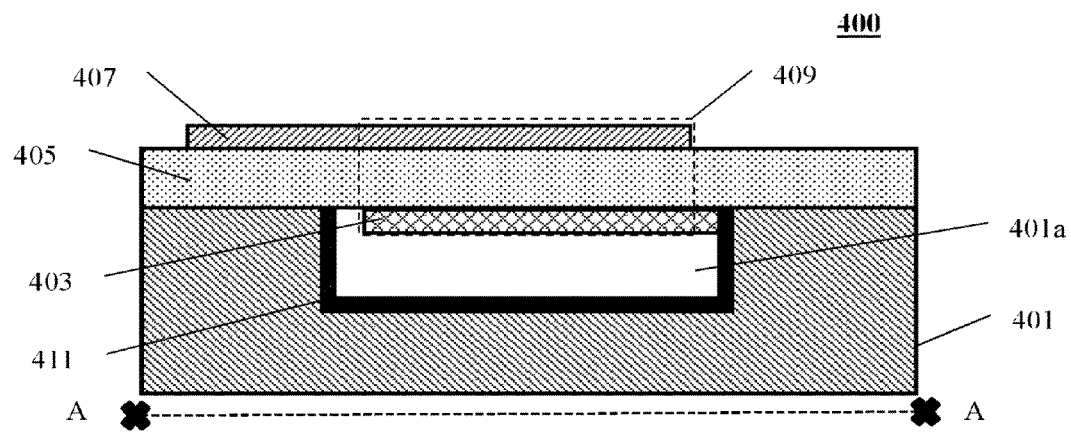
FIG. 4 illustrates a schematic structural view of a cross-section A of a bulk acoustic wave resonance device 400 according to an embodiment of the present disclosure.

FIG. 4 is a schematic structural view of a cross-section A of a bulk acoustic wave resonance device 400 according to an embodiment of the present disclosure.

As shown in FIG. 4, embodiments of the present disclosure provide a bulk acoustic wave resonance device 400. The bulk acoustic wave resonance device 400 includes a substrate 401, an etch shield layer 411, an electrode layer 403, a piezoelectric layer 405 and an electrode layer 407. The substrate 401 includes a cavity 401a embedded at an upper surface of the substrate 401. The etch shield layer 411 is disposed within the cavity 401a and covers a bottom and a side wall of the cavity 401a. A first end of the electrode layer 403 is in contact with the etch shield layer 411, and a second end of the electrode layer 403 is disposed in the cavity 401a. The piezoelectric layer 405 is disposed on the substrate 401 and the electrode layer 403. The piezoelectric layer 405 is a flat layer and covers the cavity 401a. The electrode layer 407 is disposed on the piezoelectric layer 405. As can be seen in FIG. 4, a resonance region 409 (i.e., an overlap region of the electrode layer 403 and the electrode layer 407) is suspended relative to the cavity 401a, and neither overlaps with nor is in contact with the substrate 401. Thus, a perpendicular projection of the resonance region 409 perpendicular to the upper surface is falls within the cavity 401a, which increase the difference between the acoustic impedance of the resonance region 409 and the acoustic impedance of the non-resonance region, thereby increasing the Q value of the resonance device.

In some embodiments, the material of the substrate 401 includes, but is not limited to, at least one of silicon, silicon carbide, and glass.

In some embodiments, the material of the etch shield layer 411 includes, but is not limited to, at least one of aluminum nitride, silicon carbide, diamond, silicon nitride, silicon dioxide, aluminum oxide, and titanium dioxide.

It should be noted that the etch shield layer 411 can serve to protect the substrate 401 when forming the cavity 401a by etch. In addition, the etch shield layer 411 may protect the resonance device from being corroded by water or oxygen.

In some embodiments, the thickness of the etch shield layer 411 includes, but is not limited to 0.1 micrometer to 3 micrometers. In some embodiments, the thickness of the etch shield layer 411 includes, but is not limited to 2 micrometers to 6 micrometers.

In some embodiments, the piezoelectric layer 405 covers the upper surface of the substrate 401. In some embodiments, the material of the piezoelectric layer 405 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 405 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first to stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 405 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 405 on a plane may allow the piezoelectric layer 405 not to include a crystal grain which suffers from a significant change to its orientation, thereby helping to increase the electromechanical coupling factor of the resonance device and the Q value of the resonance device.

In some embodiments, a portion of the electrode layer 403 overlapping with the electrode layer 407 is disposed within the cavity 401a, and a portion of the electrode layer 407 overlapping with the electrode layer 403 is disposed above the cavity 401a.

In some embodiments, the material of the electrode layer 403 includes, but is not limited to, at least one of molybdenum, ruthenium, tungsten, platinum, iridium and aluminum, and the material of the electrode layer 407 includes, but is not limited to, at least one of molybdenum, ruthenium, tungsten, platinum, iridium and aluminum.

In some embodiments, the electrode layer 403 includes a negative electrode and the electrode layer 407 includes a positive electrode. In some embodiments, the electrode layer 403 includes a positive electrode and the electrode layer 407 includes a negative electrode. In some embodiments, the electrode layer 403 includes a positive electrode and a negative electrode and the electrode layer 407 includes a positive electrode and a negative electrode.

Figure 5:
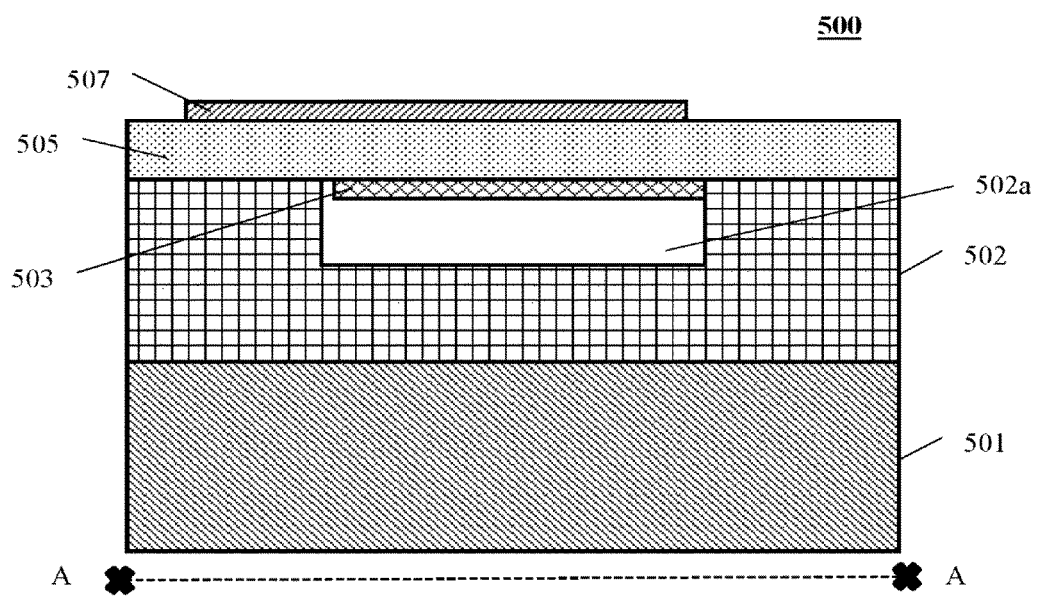
FIG. 5 illustrates a schematic structural view of a cross-section A of a bulk acoustic wave resonance device 500 according to an embodiment of the present disclosure.

FIG. 5 is a schematic structural view of a cross-section A of a bulk acoustic wave resonance device 500 according to an embodiment of the present disclosure.

As shown in FIG. 5, embodiments of the present disclosure provide a bulk acoustic wave resonance device 500. The bulk acoustic wave resonance device 500 includes a substrate 501, an intermediate layer 502, an electrode layer 503, a piezoelectric layer 505 and an electrode layer 507. The intermediate layer 502 is disposed on the substrate 501, and includes a cavity 502a embedded at an upper surface of the intermediate layer 502. A first end of the electrode layer 503 is in contact with a side wall of the cavity 502a, and a second end of the electrode layer 503 is disposed within the cavity 502a. The piezoelectric layer 505 is disposed on the intermediate layer 502 and the electrode layer 503. The piezoelectric layer 505 is a flat layer and covers the cavity 502a. The electrode layer 507 is disposed on the piezoelectric layer 505. As can be seen in FIG. 5, a resonance region (not shown, i.e., an overlap region of the electrode layer 503 and the electrode layer 507) is suspended relative to the cavity 502a, and neither overlaps with nor is in contact with the intermediate layer 502. Thus, a perpendicular projection of the resonance region (not shown) perpendicular to the upper surface falls within the cavity 502a.

Embodiments of the present disclosure may increase the difference between the acoustic impedance of the resonance region (not shown) and the non-resonance region, thereby increasing the Q value of the resonance device. In addition, the acoustic impedance of the intermediate layer 502 may be relatively smaller than that of the piezoelectric layer 505, thereby preventing waves propagating from the resonance region (not shown) to the substrate 501.

In some embodiments, the material of the substrate 501 includes, but is not limited to, at least one of silicon, silicon carbide, and glass.

In some embodiments, the material of the intermediate layer 502 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 502 includes, but is not limited to 0.1 micrometer to 10 micrometers.

In some embodiments, the piezoelectric layer 505 covers the upper surface of the substrate 501. In some embodiments, the material of the piezoelectric layer 505 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 505 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third to direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 505 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 505 on a plane may allow the piezoelectric layer 505 not to include a crystal grain which suffers from a significant change to its orientation, thereby helping to increase the electromechanical coupling factor of the to resonance device and the Q value of the resonance device.

In some embodiments, a portion of the electrode layer 503 overlapping with the electrode layer 507 is disposed within the cavity 502*a*, and a portion of the electrode layer 507 overlapping with the electrode layer 503 is disposed above the cavity 502*a*.

In some embodiments, the material of the electrode layer 503 includes, but is not limited to, at least one of molybdenum, ruthenium, tungsten, platinum, iridium and aluminum, and the material of the electrode layer 507 includes, but is not limited to, at least one of molybdenum, ruthenium, tungsten, platinum, iridium and aluminum.

In some embodiments, the electrode layer 503 includes a negative electrode and the electrode layer 507 includes a positive electrode. In some embodiments, the electrode layer 503 includes a positive electrode and the electrode layer 507 includes a negative electrode. In some embodiments, the electrode layer 503 includes a positive electrode and a negative electrode and the electrode layer 507 includes a positive electrode and a negative electrode.

Figure 6:
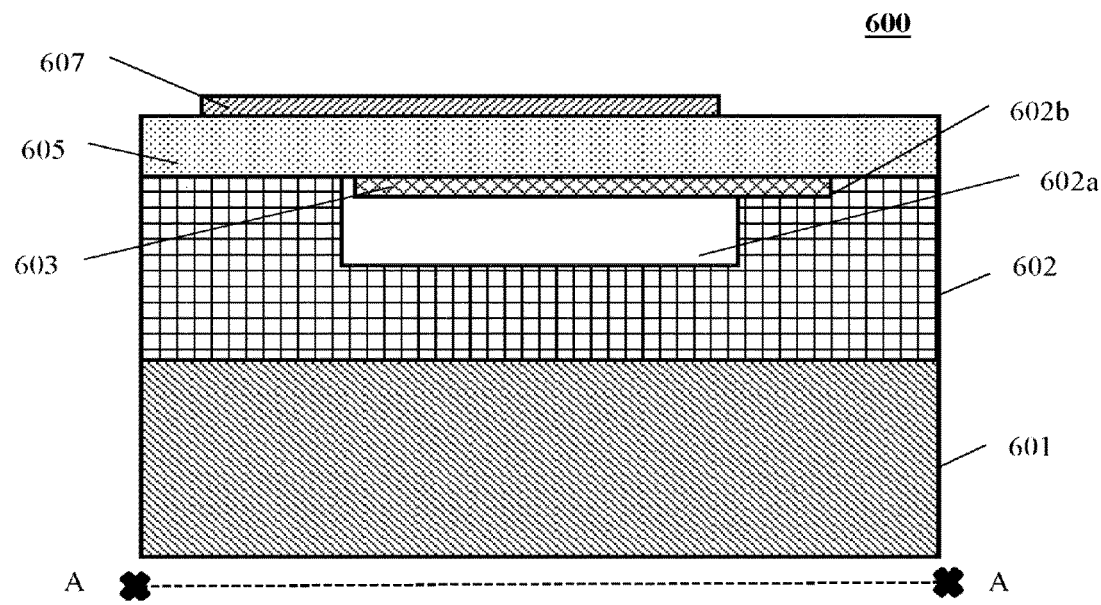
FIG. 6 illustrates a schematic structural view of a cross-section A of a bulk acoustic wave resonance device 600 according to an embodiment of the present disclosure.

FIG. 6 is a schematic structural view of a cross-section A of a bulk acoustic wave resonance device 600 according to an embodiment of the present disclosure.

As shown in FIG. 6, embodiments of the present disclosure provide a bulk acoustic wave resonance device 600. The bulk acoustic wave resonance device 600 includes a substrate 601, an intermediate layer 602, an electrode layer 603, a piezoelectric layer 605 and an electrode layer 607. The intermediate layer 602 is disposed on the substrate 601, and includes a cavity 602*a* and a groove 602*b* embedded at an upper surface of the intermediate layer 602. The groove 602*b* is disposed adjacent to the cavity 602*a* in a horizontal direction and communicated with the cavity 602*a*, and a depth of the groove 602*b* is less than a depth of the cavity 602*a*. A first end of the electrode layer 603 is disposed within the groove 602*b*, a second end of the electrode layer 603 is disposed within the cavity 602*a*, and the depth of the groove 602*b* is equal to a thickness of the electrode layer 603. The piezoelectric layer 605 is disposed on the intermediate layer 602 and the electrode layer 603. The piezoelectric layer 605 is a flat layer and covers the cavity 602*a*. The electrode layer 607 is disposed on the piezoelectric layer 605. As can be seen in FIG. 6, a resonance region (not shown, i.e., an overlap region of the electrode layer 603 and the electrode layer 607) is suspended relative to the cavity 602*a*, and neither overlaps with nor is in contact with the intermediate layer 602, thus a perpendicular projection of the resonance region (not shown) perpendicular to the upper surface falls within the cavity 602*a*.

Embodiments of the present disclosure may increase the difference between the acoustic impedance of the resonance region (not shown) and the acoustic impedance of non-resonance region, thereby increasing the Q value of the resonance device. In addition, the acoustic impedance of the intermediate layer 602 may be relatively smaller than that of the piezoelectric layer 605, thereby preventing waves propagating from the resonance region (not shown) to the substrate 601.

In some embodiments, the material of the substrate 601 includes, but is not limited to, at least one of silicon, silicon carbide, and glass.

In some embodiments, the material of the intermediate layer 602 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 602 includes, but is not limited to 0.1 micrometer to 10 micrometers.

In some embodiments, the piezoelectric layer 605 covers the upper surface of the substrate 601. In some embodiments, the material of the piezoelectric layer 605 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 605 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 605 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 605 on a plane may allow the piezoelectric layer 605 not to include a crystal grain which suffers from a significant change to its orientation, thereby helping to increase the electromechanical coupling factor of the resonance device and the Q value of the resonance device.

In some embodiments, a portion of the electrode layer 603 overlapping with the electrode layer 607 is disposed within the cavity 602a, and a portion of the electrode layer 607 overlapping with the electrode layer 603 is disposed above the cavity 602a.

In some embodiments, the material of the electrode layer 603 includes, but is not limited to, at least one of molybdenum, ruthenium, tungsten, platinum, iridium and aluminum, and the material of the electrode layer 607 includes, but is not limited to, at least one of molybdenum, ruthenium, tungsten, platinum, iridium and aluminum.

In some embodiments, the electrode layer 603 includes a negative electrode and the electrode layer 607 includes a positive electrode. In some embodiments, the electrode layer 603 includes a positive electrode and the electrode layer 607 includes a negative electrode. In some embodiments, the electrode layer 603 includes a positive electrode and a negative electrode and the electrode layer 607 includes a positive electrode and a negative electrode.

Figure 7:
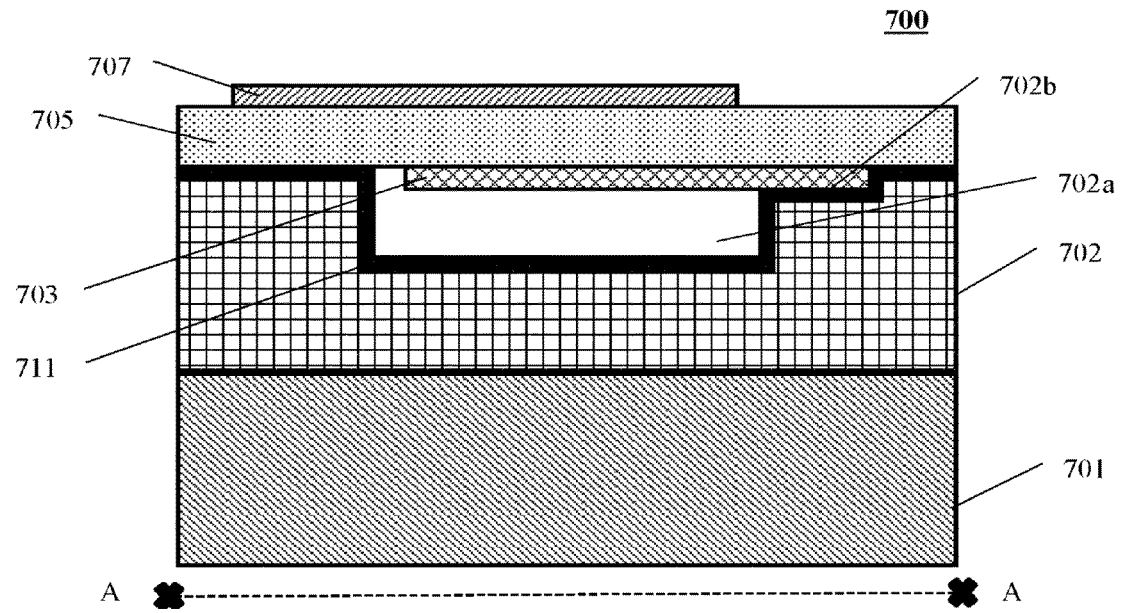
FIG. 7 illustrates a schematic structural view of a cross-section A of a bulk acoustic wave resonance device 700 according to an embodiment of the present disclosure.

FIG. 7 is a schematic structural view of a cross-section A of a bulk acoustic wave resonance device 700 according to an embodiment of the present disclosure.

As shown in FIG. 7, embodiments of the present disclosure provide a bulk acoustic wave resonance device 700. The bulk acoustic wave resonance device 700 includes a substrate 701, an intermediate layer 702, an etch shield layer 711, an electrode layer 703, a piezoelectric layer 705, and an electrode layer 707. The intermediate layer 702 is disposed on the substrate 701, and includes a cavity 702a and a groove 702b embedded at an upper surface of the intermediate layer 702. The groove 702b is disposed adjacent to the cavity 702a in a horizontal direction and communicated with the cavity 702a, and a depth of the groove 702b is less than a depth of the cavity 702a. The etch shield layer 711 covers a bottom and a side wall of the cavity 702a, a bottom and a side wall of the groove 702b, and the upper surface of the intermediate layer 702. A first end of the electrode layer 703 is disposed within the groove 702b, a second end of the electrode layer 703 is disposed within the cavity 702a, and the depth of the groove 702b is equal to the sum of a thickness of the etch shield layer 711 and a thickness of the electrode layer 703. The piezoelectric layer 705 is disposed on the etch shield layer 711 and the electrode layer 703. The piezoelectric layer 705 is a flat layer and covers the cavity 702a. The electrode layer 707 is disposed on the piezoelectric layer 705. As can be seen in FIG. 7, a resonance region (not shown, i.e., an overlap region of the electrode layer 703 and the electrode layer 707) is suspended relative to the cavity 702a, and neither overlaps with nor is in contact with the intermediate layer 702 and the etch shield layer 711, thus a perpendicular projection of the resonance region (not shown) perpendicular to the upper surface falls within the cavity 702a.

Embodiments of the present disclosure may increase the difference between the acoustic impedance of the resonance region (not shown) and the acoustic impedance of non-resonance region, thereby increasing the Q value of the resonance device. In addition, the acoustic impedance of the intermediate layer 702 may be relatively smaller than that of the piezoelectric layer 705, thereby preventing waves propagating from the resonance region (not shown) to the substrate 701.

In some embodiments, the material of the substrate 701 includes, but is not limited to, at least one of silicon, silicon carbide, and glass.

In some embodiments, the material of the intermediate layer 702 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 702 includes, but is not limited to 0.1 micrometer to 10 micrometers.

In some embodiments, the material of the etch shield layer 711 includes, but is not limited to, at least one of aluminum nitride, silicon carbide, diamond, silicon nitride, silicon dioxide, aluminum oxide, and titanium dioxide.

It should be noted that the etch shield layer 711 may serve to protect the intermediate layer 702 when forming the cavity 702a by etch. In addition, the etch shield layer 711 may protect the resonance device from being corroded by water or oxygen.

In some embodiments, the thickness of the etch shield layer 711 includes, but is not limited to: 0.1 micrometer to 3 micrometers.

In some embodiments, the piezoelectric layer 705 covers the etch shield layer 711. In some embodiments, the material of the piezoelectric layer 705 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 705 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal, such as an aluminum nitride crystal, may be represented by an ac stereoscopic coordinate system (including a-axis and c-axis). As shown in FIG. 14, the crystal grains of (i) orthorhombic system (a≠b≠c), (ii) tetragonal system (a=b (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 705 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 705 on a plane may allow the piezoelectric layer 705 not to include a crystal grain which suffers from a significant change to its orientation, thereby helping to increase the electromechanical coupling factor of the resonance device and the Q value of the resonance device.

In some embodiments, a portion of the electrode layer 703 overlapping with the electrode layer 707 is disposed within the cavity 702*a*, and a portion of the electrode layer 707 overlapping with the electrode layer 703 is disposed above the cavity 702*a*.

In some embodiments, the material of the electrode layer 703 includes, but is not limited to, at least one of molybdenum, ruthenium, tungsten, platinum, iridium and aluminum, and the material of the electrode layer 707 includes, but is not limited to, at least one of molybdenum, ruthenium, tungsten, platinum, iridium and aluminum.

In some embodiments, the electrode layer 703 includes a negative electrode and the electrode layer 707 includes a positive electrode. In some embodiments, the electrode layer 703 includes a positive electrode and the electrode layer 707 includes a negative electrode. In some embodiments, the electrode layer 703 includes a positive electrode and a negative electrode and the electrode layer 707 includes a positive electrode and a negative electrode.

Figure 8:
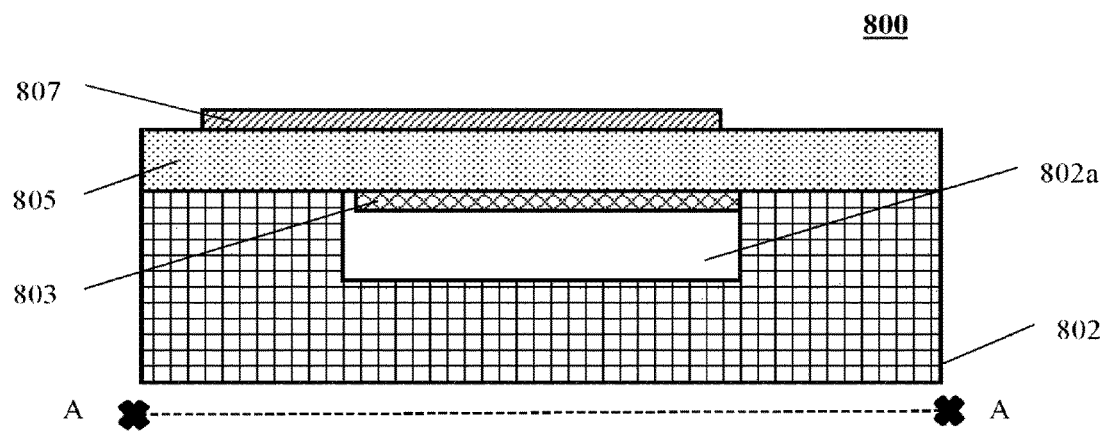
FIG. 8 illustrates a schematic structural view of a cross-section A of a bulk acoustic wave resonance device 800 according to an embodiment of the present disclosure.

FIG. 8 is a schematic structural view of a cross-section A of a bulk acoustic wave resonance device 800 according to an embodiment of the present disclosure.

As shown in FIG. 8, embodiments of the present disclosure provide a bulk acoustic wave resonator device 800. The bulk acoustic wave resonator device 800 includes a support layer 802, an electrode layer 803, a piezoelectric layer 805 and an electrode layer 807. The support layer 802 includes a cavity 802*a* embedded at an upper surface of the support layer 802. A first end of the electrode layer 803 is in contact with a side wall of the cavity 802*a*, and a second end of the electrode layer 803 is disposed within the cavity 802*a*. The piezoelectric layer 805 is disposed on the support layer 802 and the electrode layer 803. The piezoelectric layer 805 is a flat layer and covers the cavity 802*a*. The electrode layer 807 is disposed on the piezoelectric layer 805. As can be seen in FIG. 8, a resonance region (not shown, i.e., an overlap region of the electrode layer 803 and the electrode layer 807) is suspended relative to the cavity 802*a*, and neither overlaps with nor is in contact with the support layer 802, so that a perpendicular projection of the resonance region (not shown) perpendicular to the upper surface falls within the cavity 802*a*.

Embodiments of the present disclosure may increase the difference between the acoustic impedance of the resonance region (not shown) and the acoustic impedance of the non-resonance region, thereby increasing the Q value of the resonance device. In addition, the resonance device 800 according to the present disclosure does not include a substrate, thereby eliminating electrical losses caused by the substrate.

In some embodiments, the material of the support layer 802 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the support layer 802 includes, but is not limited to 20 micrometers to 100 micrometers.

In some embodiments, the piezoelectric layer 805 covers the upper surface of the support layer 802. In some embodiments, the material of the piezoelectric layer 805 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 805 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a b c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 805 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 805 on a plane may allow the piezoelectric layer 805 not to include a crystal grain which suffers from a significant change to its orientation, thereby helping to increase the electromechanical coupling factor of the resonance device and the Q value of the resonance device.

In some embodiments, a portion of the electrode layer 803 overlapping with the electrode layer 807 is disposed within the cavity 802a, and a portion of the electrode layer 807 overlapping with the electrode layer 803 is disposed above the cavity 802a.

In some embodiments, the material of the electrode layer 803 includes, but is not limited to, at least one of molybdenum, ruthenium, tungsten, platinum, iridium and aluminum, and the material of the electrode layer 807 includes, but is not limited to, at least one of molybdenum, ruthenium, tungsten, platinum, iridium and aluminum.

In some embodiments, the electrode layer 803 includes a negative electrode and the electrode layer 807 includes a positive electrode. In some embodiments, the electrode layer 803 includes a positive electrode and the electrode layer 807 includes a negative electrode. In some embodiments, the electrode layer 803 includes a positive electrode and a negative electrode and the electrode layer 807 includes a positive electrode and a negative electrode.

Figure 9:
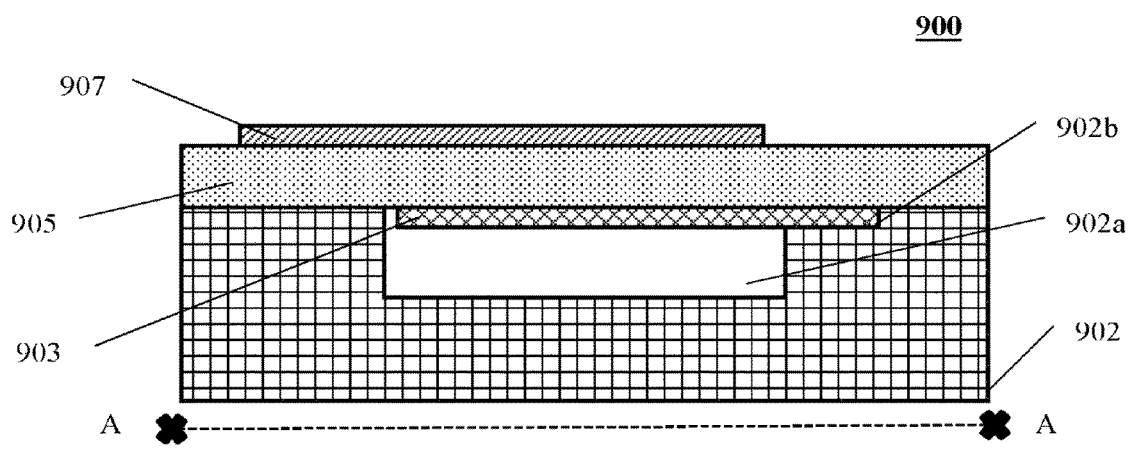
FIG. 9 illustrates a schematic structural view of a cross-section A of a bulk acoustic wave resonance device 900 according to an embodiment of the present disclosure.

FIG. 9 is a schematic structural view of a cross-section A of a bulk acoustic wave resonance device 900 according to an embodiment of the present disclosure.

As shown in FIG. 9, embodiments of the present disclosure provide a bulk acoustic wave resonance device 900. The bulk acoustic wave resonance device 900 includes a support layer 902, an electrode layer 903, a piezoelectric layer 905 and an electrode layer 907. The support layer 902 includes a cavity 902a and a groove 902b embedded at an upper surface of the support layer 902. The groove 902b is disposed adjacent to the cavity 902a in a horizontal direction and communicated with the cavity 902a, and a depth of the groove 902b is less than a depth of the cavity 902a. A first end of the electrode layer 903 is disposed within the groove 902b, a second end of the electrode layer 903 is disposed within the cavity 902a, and the depth of the groove 902b is equal to a thickness of the electrode layer 903. The piezoelectric layer 905 is disposed on the support layer 902 and the electrode layer 903. The piezoelectric layer 905 is a flat layer and covers the cavity 902a. The electrode layer 907 is disposed on the piezoelectric layer 905. As can be seen in FIG. 9, a resonance region (not shown, i.e., an overlap region of the electrode layer 903 and the electrode layer 907) is suspended relative to the cavity 902a, and neither overlaps with nor is in contact with the support layer 902, so that a perpendicular projection of the resonance region (not shown) perpendicular to the upper surface falls within the cavity 902a.

Embodiments of the present disclosure may increase the difference between the acoustic impedance of the resonance region (not shown) and the acoustic impedance of the non-resonance region, thereby increasing the Q value of the resonance device. In addition, the resonance device 900 according to the present disclosure does not include a substrate, thereby eliminating electrical losses caused by the substrate.

In some embodiments, the material of the support layer 902 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the support layer 902 includes, but is not limited to 20 micrometers to 100 micrometers.

In some embodiments, the piezoelectric layer 905 covers the upper surface of the support layer 902. In some embodiments, the material of the piezoelectric layer 905 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 905 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system ($a \neq b \neq c$), (ii) tetragonal system ($a=b \neq c$), (iii) cubic system ($a=b=c$), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 905 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 905 on a plane may allow the piezoelectric layer 905 not to include a crystal grain which suffers from a significant change to its orientation, thereby helping to increase the electromechanical coupling factor of the resonance device and the Q value of the resonance device.

In some embodiments, a portion of the electrode layer 903 overlapping with the electrode layer 907 is disposed within the cavity 902a, and a portion of the electrode layer 907 overlapping with the electrode layer 903 is disposed above the cavity 902a.

In some embodiments, the material of the electrode layer 903 includes, but is not limited to, at least one of molybdenum, ruthenium, tungsten, platinum, iridium and aluminum, and the material of the electrode layer 907 includes, but is not limited to, at least one of molybdenum, ruthenium, tungsten, platinum, iridium and aluminum.

In some embodiments, the electrode layer 903 includes a negative electrode and the electrode layer 907 includes a positive electrode. In some embodiments, the electrode layer 903 includes a positive electrode and the electrode layer 907 includes a negative electrode. In some embodiments, the electrode layer 903 includes a positive electrode and a negative electrode and the electrode layer 907 includes a positive electrode and a negative electrode.

Figure 10:
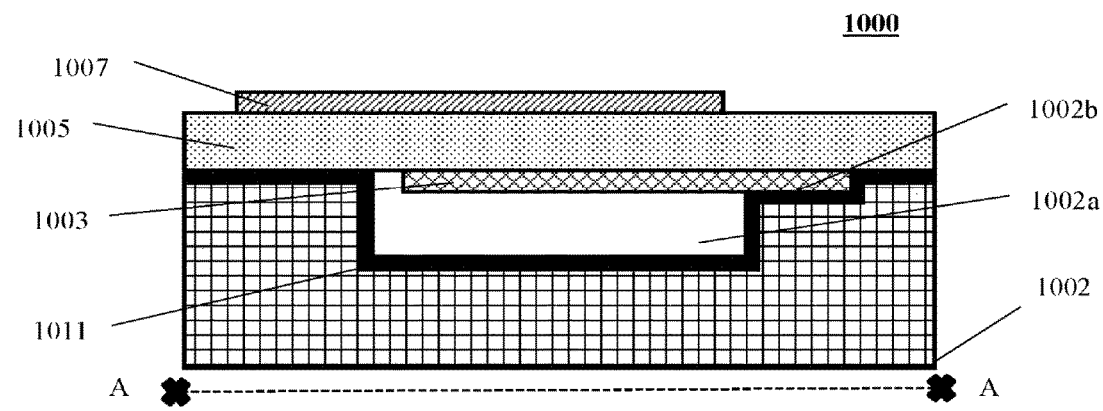
FIG. 10 illustrates a schematic structural view of a cross-section A of a bulk acoustic wave resonance device 1000 according to an embodiment of the present disclosure.

FIG. 10 is a schematic structural view of a cross-section A of a bulk acoustic wave resonance device 1000 according to an embodiment of the present disclosure.

As shown in FIG. 10, embodiments of the present disclosure provide a bulk acoustic wave resonance device 1000. The bulk acoustic wave resonance device 1000 includes a support layer 1002, an etch shield layer 1011, an electrode layer 1003, a piezoelectric layer 1005 and an electrode layer 1007. The support layer 1002 includes a cavity 1002a and a groove 1002b embedded at an upper surface of the support layer 1002. The groove 1002b is disposed adjacent to the cavity 1002a in a horizontal direction and communicated with the cavity 1002a, and a depth of the groove 1002b is less than a depth of the cavity 1002a. The etch shield layer 1011 covers a bottom and a side wall of the cavity 1002a, a bottom and a side wall of the groove 1002b and the upper surface of the support layer 1002. A first end of the electrode layer 1003 is disposed within the groove 1002b, a second end of the electrode layer 1003 is disposed within the cavity 1002a, and the depth of the groove 1002b is equal to the sum of a thickness of the etch shield layer 1011 and a thickness of the electrode layer 1003. The piezoelectric layer 1005 is disposed on the etch shield layer 1011 and the electrode layer 1003. The piezoelectric layer 1005 is a flat layer and covers the cavity 1002a. The electrode layer 1007 is disposed on the piezoelectric layer 1005. As can be seen in FIG. 10, a resonance region (not shown, i.e., an overlap region of the electrode layer 1003 and the electrode layer 1007) is suspended relative to the cavity 1002a, and neither overlaps with nor is in contact with the support layer 1002 and the etch shield layer 1011, so that a perpendicular projection of the resonance region (not shown) perpendicular to the upper surface falls within the cavity 1002a.

Embodiments of the present disclosure may increase the difference between the acoustic impedance of the resonance region (not shown) and the acoustic impedance of the non-resonance region, thereby increasing the Q value of the resonance device. In addition, the resonance device 1000 according to the present disclosure does not include a substrate, thereby eliminating electrical losses caused by the substrate.

In some embodiments, the material of the support layer 1002 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the support layer 1002 includes, but is not limited to 20 micrometers to 100 micrometers.

In some embodiments, the material of the etch shield layer 1011 includes, but is not limited to, at least one of aluminum nitride, silicon carbide, diamond, silicon nitride, silicon dioxide, aluminum oxide, and titanium dioxide.

It should be noted that the etch shield layer 1011 may serve to protect the support layer 1002 when forming the cavity 1002a by etch. In addition, the etch shield layer 1011 may protect the resonance device from being corroded by water or oxygen.

In some embodiments, the thickness of the etch shield layer 1011 includes, but is not limited to 2 micrometers to 6 micrometers.

In some embodiments, the piezoelectric layer 1005 covers the etch shield layer 1011. In some embodiments, the material of the piezoelectric layer 1005 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 1005 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 1005 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 1005 on a plane may allow the piezoelectric layer 1005 not to include a crystal grain which suffers from a significant change to its orientation, thereby helping to increase the electromechanical coupling factor of the resonance device and the Q value of the resonance device.

In some embodiments, a portion of the electrode layer 1003 overlapping with the electrode layer 1007 is disposed within the cavity 1002*a*, and a portion of the electrode layer 1007 overlapping with the electrode layer 1003 is disposed above the cavity 1002*a*.

In some embodiments, the material of the electrode layer 1003 includes, but is not limited to, at least one of molybdenum, ruthenium, tungsten, platinum, iridium and aluminum, and the material of the electrode layer 1007 includes, but is not limited to, at least one of molybdenum, ruthenium, tungsten, platinum, iridium and aluminum.

In some embodiments, the electrode layer 1003 includes a negative electrode and the electrode layer 1007 includes a positive electrode. In some embodiments, the electrode layer 1003 includes a positive electrode and the electrode layer 1007 includes a negative electrode. In some embodiments, the electrode layer 1003 includes a positive electrode and a negative electrode and the electrode layer 1007 includes a positive electrode and a negative electrode.

Figure 11:
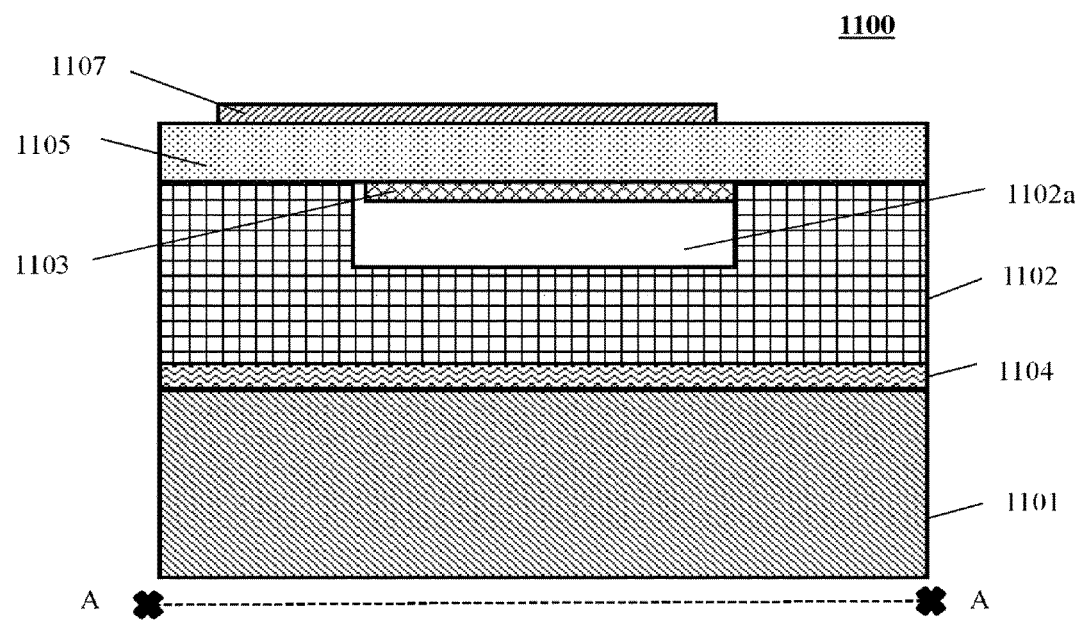
FIG. 11 illustrates a schematic structural view of a cross-section A of a bulk acoustic wave resonance device 1100 according to an embodiment of the present disclosure.

FIG. 11 is a schematic structural view of a cross-section A of a bulk acoustic wave resonance device 1100 according to an embodiment of the present disclosure.

As shown in FIG. 11, embodiments of the present disclosure provide a bulk acoustic wave resonance device 1100. The bulk acoustic wave resonance device 1100 includes a substrate 1101, a film 1104, an intermediate layer 1102, an electrode layer 1103, a piezoelectric layer 1105 and an electrode layer 1107. The film 1104 is disposed on the substrate 1101. The intermediate layer 1102 is disposed on the film 1104, and includes a cavity 1102*a* embedded at an upper surface of the intermediate layer 1102. A first end of the electrode layer 1103 is in contact with a side wall of the cavity 1102*a*, and a second end of the electrode layer 1103 is disposed within the cavity 1102*a*. The piezoelectric layer 1105 is disposed on the intermediate layer 1102 and the electrode layer 1103. The piezoelectric layer 1105 is a flat layer and covers the cavity 1102*a*. The electrode layer 1107 is disposed on the piezoelectric layer 1105. As can be seen in FIG. 11, a resonance region (not shown, i.e., an overlap region of the electrode layer 1103 and the electrode layer 1107) is suspended relative to the cavity 1102*a*, and neither overlaps with nor is in contact with the intermediate layer 1102, so that a perpendicular projection of the resonance region (not shown) perpendicular to the upper surface falls within the cavity 1102*a*.

Embodiments of the present disclosure may increase the difference between the acoustic impedance of the resonance region (not shown) and the acoustic impedance of the non-resonance region, thereby improving the Q value of the resonance device. In addition, the acoustic impedance of the intermediate layer 1102 may be relatively smaller than that of the piezoelectric layer 1105, thereby preventing waves propagating from the resonance region (not shown) to the substrate 1101. In addition, the film 1104 (for example, a trap rich layer) helps to prevent formation of a free electron layer on a surface of the substrate 1101 to reduce the electrical loss caused by the substrate 1101.

In some embodiments, the material of the substrate 1101 includes, but is not limited to, at least one of silicon, silicon carbide and glass.

In some embodiments, the film 1104 includes, but is not limited to, a polycrystalline film. In some embodiments, the material of the polycrystalline film includes, but is not limited to, at least one of polysilicon, polycrystalline silicon nitride, and polycrystalline silicon carbide.

In some embodiments, the material of the intermediate layer 1102 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 1102 includes, but is not limited to 0.1 micrometer to 10 micrometers.

In some embodiments, the piezoelectric layer 1105 covers the upper surface of the intermediate layer 1102. In some embodiments, the material of the piezoelectric layer 1105 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 1105 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first to stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 1105 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 1105 on a plane may allow the piezoelectric layer 1105 not to include a crystal grain which suffers from a significant change to its orientation, thereby helping to increase the electromechanical coupling factor of the resonance device and the Q value of the resonance device.

In some embodiments, a portion of the electrode layer 1103 overlapping with the electrode layer 1107 is disposed within the cavity 1102a, and a portion of the electrode layer 1107 overlapping with the electrode layer 1103 is disposed above the cavity 1102a.

In some embodiments, the material of the electrode layer 1103 includes, but is not limited to, at least one of molybdenum, ruthenium, tungsten, platinum, iridium and aluminum, and the material of the electrode layer 1107 includes, but is not limited to, at least one of molybdenum, ruthenium, tungsten, platinum, iridium and aluminum.

In some embodiments, the electrode layer 1103 includes a negative electrode and the electrode layer 1107 includes a positive electrode. In some embodiments, the electrode layer 1103 includes a positive electrode and the electrode layer 1107 includes a negative electrode. In some embodiments, the electrode layer 1103 includes a positive electrode and a negative electrode and the electrode layer 1107 includes a positive electrode and a negative electrode.

Figure 12:
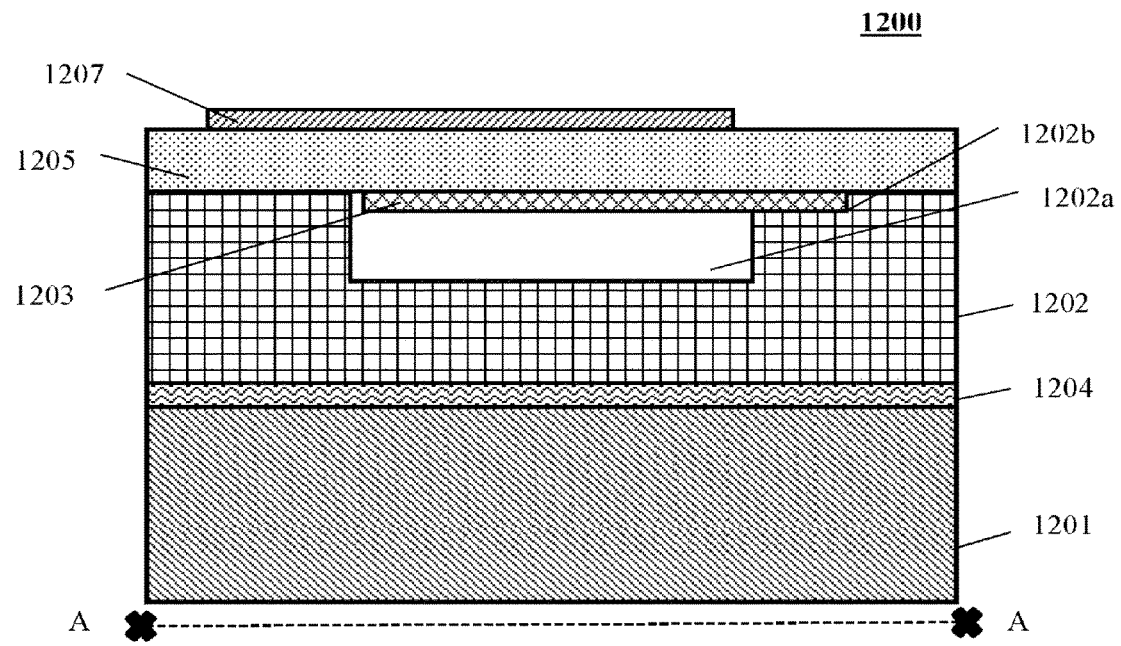
FIG. 12 illustrates a schematic structural view of a cross-section A of a bulk acoustic wave resonance device 1200 according to an embodiment of the present disclosure.

FIG. 12 is a schematic structural view of a cross-section A of a bulk acoustic wave resonance device 1200 according to an embodiment of the present disclosure.

As shown in FIG. 12, embodiments of the present disclosure provide a bulk acoustic wave resonance device 1200. The bulk acoustic wave resonance device 1200 includes a substrate 1201, a film 1204, an intermediate layer 1202, an electrode layer 1203, a piezoelectric layer 1205 and an electrode layer 1207. The film 1204 is disposed on the substrate 1201. The intermediate layer 1202 is disposed on the film 1204, and includes a cavity 1202a and a groove 1202b embedded at an upper surface of the intermediate layer 1202. The groove 1202b is disposed adjacent to the cavity 1202a in a horizontal direction and communicated with the cavity 1202a, and a depth of the groove 1202b is less than a depth of the cavity 1202a. A first end of the electrode layer 1203 is located within the groove 1202b, a second end of the electrode layer 1203 is located within the cavity 1202a, and the depth of the groove 1202b is equal to a thickness of the electrode layer 1203. The piezoelectric layer 1205 is disposed on the intermediate layer 1202 and the electrode layer 1203. The piezoelectric layer 1205 is a flat layer and covers the cavity 1202a. The electrode layer 1207 is disposed on the piezoelectric layer 1205. As can be seen in FIG. 12, a resonance region (not shown, i.e., an overlap region of the electrode layer 1203 and the electrode layer 1207) is suspended relative to the cavity 1202a, and neither overlaps with nor is in contact with the intermediate layer 1202, so that a perpendicular projection of the resonance region (not shown) perpendicular to the upper surface falls within the cavity 1202a.

Embodiments of the present disclosure may increase the difference between the acoustic impedance of the resonance region (not shown) and the acoustic impedance of the non-resonance region, thereby increasing the Q value of the resonance device. In addition, the acoustic impedance of the intermediate layer 1202 may be relatively smaller than that of the piezoelectric layer 1205, thereby preventing waves propagating from the resonance region (not shown) to the substrate 1201. In addition, the film 1204 helps to prevent formation of a free electron layer on a surface of the substrate 1201 to reduce the electrical loss caused by the substrate 1201.

In some embodiments, the material of the substrate 1201 includes, but is not limited to, at least one of silicon, silicon carbide, and glass.

In some embodiments, the film 1204 includes, but is not limited to, a polycrystalline film. In some embodiments, the material of the polycrystalline film includes, but is not limited to, at least one of polysilicon, polycrystalline silicon nitride, and polycrystalline silicon carbide.

In some embodiments, the material of the intermediate layer 1202 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 1202 includes, but is not limited to 0.1 micrometer to 10 micrometers.

In some embodiments, the piezoelectric layer 1205 covers the upper surface of the intermediate layer 1202. In some embodiments, the material of the piezoelectric layer 1205 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 1205 includes crystal grains. Crystal grains include a first crystal grain and a second crystal grain, and the first crystal grain and the second crystal grain are any two crystal grains of crystal grains. In some embodiment, crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 1205 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at an angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 1205 on a plane may allow the piezoelectric layer 1205 not to include a crystal grain which suffers from a significant change to its orientation, thereby helping to increase the electromechanical coupling factor of the resonance device and the Q value of the resonance device.

In some embodiments, a portion of the electrode layer 1203 overlapping with the electrode layer 1207 is disposed within the cavity 1202a, and a portion of the electrode layer 1207 overlapping with the electrode layer 1203 is disposed above the cavity 1202a.

In some embodiments, the material of the electrode layer 1203 includes, but is not limited to, at least one of molybdenum, ruthenium, tungsten, platinum, iridium and aluminum, and the material of the electrode layer 1207 includes, but is not limited to, at least one of molybdenum, ruthenium, tungsten, platinum, iridium and aluminum.

In some embodiments, the electrode layer 1203 includes a negative electrode and the electrode layer 1207 includes a positive electrode. In some embodiments, the electrode layer 1203 includes a positive electrode and the electrode layer 1207 includes a negative electrode. In some embodiments, the electrode layer 1203 includes a positive electrode and a negative electrode and the electrode layer 1207 includes a positive electrode and a negative electrode.

Embodiments of the present disclosure also provide a bulk acoustic wave filter device. The bulk acoustic wave filter includes, but is not limited to, at least one bulk acoustic wave resonance device according to any one of above embodiments.

In view of the above, the present disclosure can increase difference between an acoustic impedance of a resonance region and that of a non-resonance region by adjusting positions of two electrode layers so that there is neither overlap nor contact between the resonance region and an intermediate layer or a support layer or a first substrate, and the resonance region is suspended relative to a cavity of the intermediate layer or the support layer or the first substrate, thereby increasing a Q value of a resonance device. In addition, a piezoelectric layer is formed on a flat surface, which allows the piezoelectric layer not to include a crystal grain which suffers from a significant change to its orientation, thereby helping to increase the electromechanical coupling factor of the resonance device and the Q value of the resonance device. Further, the intermediate layer has a relatively smaller acoustic impedance than that of the piezoelectric layer, thereby preventing waves propagating from the resonance region to the second substrate. In addition, a film is disposed between the intermediate layer and the second substrate, which helps to prevent formation of a free electron layer on a surface of the second substrate, thereby reducing electrical loss caused by the second substrate.

It should be understood that examples and embodiments herein are only exemplary, and those skilled in the art can make various modifications and corrections without departing from the spirit and scope of the present disclosure.

The invention claimed is:

1. A bulk acoustic wave resonance device, comprising:
   a first layer comprising a first cavity disposed at a first side of the first layer;
   a first electrode layer, wherein a first end of the first electrode layer is in contact with the first layer, and a second end of the first electrode layer is disposed within the first cavity;
   a second layer disposed at the first side and disposed on the first electrode layer, wherein the second layer is a flat layer and covers the first cavity; and
   a second electrode layer disposed at the first side and disposed on the second layer,
   wherein a first portion of the first electrode layer overlapping with the second electrode layer is disposed within the first cavity;
   wherein the second layer comprises a piezoelectric layer comprising crystal grains comprising a first crystal grain and a second crystal grain, and the first crystal grain and the second crystal grain are any two crystal grains of the crystal grains, wherein a first coordinate axis along a first direction corresponds to a height of the first crystal grain, a second coordinate axis along a second direction corresponds to a height of the second crystal grain, and the first direction is the same as or opposite to the second direction.

2. The bulk acoustic wave resonance device according to claim 1, wherein the first layer further comprises an intermediate layer, and the intermediate layer comprises the first cavity.

3. The bulk acoustic wave resonance device according to claim 2, wherein the intermediate layer is made of one or more materials selected from a group consisting of polymer and insulating dielectric.

4. The bulk acoustic wave resonance device according to claim 3, wherein the polymer comprises at least one selected from a group consisting of benzocyclobutene, photosensitive epoxy resin photoresist, and polyimide.

5. The bulk acoustic wave resonance device according to claim 3, wherein the insulating dielectric comprises at least one selected from a group consisting of aluminum nitride, silicon dioxide, silicon nitride, and titanium oxide.

6. The bulk acoustic wave resonance device according to claim 2, wherein the intermediate layer has a thickness ranging from 0.1 micrometer to 10 micrometers.

7. The bulk acoustic wave resonance device according to claim 1, wherein the first layer further comprises a support layer, and the support layer comprises the first cavity.

8. The bulk acoustic wave resonance device according to claim 1, wherein the first layer further comprises a first substrate, and the first substrate comprises the first cavity.

9. The bulk acoustic wave resonance device according to claim 8, wherein the first substrate is made of one or more materials selected from a group consisting of silicon, silicon carbide and glass.

10. The bulk acoustic wave resonance device according to claim 1, wherein the first layer further comprises an etch shield layer covering at least a bottom or a side wall of the first cavity.

11. The bulk acoustic wave resonance device according to claim 10, wherein the etch shield layer is made of one or more materials selected from a group consisting of aluminum nitride, silicon carbide, diamond, silicon nitride, silicon dioxide, aluminum oxide and titanium dioxide.

12. The bulk acoustic wave resonance device according to claim 10, wherein the etch shield layer has a thickness ranging from 0.1 micrometer to 3 micrometers.

13. The bulk acoustic wave resonance device according to claim 10, wherein the etch shield layer has a thickness ranging from 2 micrometers to 6 micrometers.

14. The bulk acoustic wave resonance device according to claim 1, wherein the first layer further comprises a first groove disposed at the first side, wherein the first groove is disposed adjacent to the first cavity in a horizontal direction and communicated with the first cavity, and the first end is disposed within the first groove.

15. The bulk acoustic wave resonance device according to claim 1, wherein the first crystal grain corresponds to a first coordinate system comprising the first coordinate axis and a third coordinate axis along a third direction, and the second crystal grain corresponds to a second coordinate system comprising the second coordinate axis and a fourth coordinate axis along a fourth direction.

16. The bulk acoustic wave resonance device according to claim 15, wherein the first coordinate system further comprises a fifth coordinate axis along a fifth direction and the second coordinate system further comprises a sixth coordinate axis along a sixth direction.

17. The bulk acoustic wave resonance device according to claim 16, wherein the third direction is the same as or opposite to the fourth direction.

18. The bulk acoustic wave resonance device according to claim 1, wherein the piezoelectric layer is made of one or more materials selected from a group consisting of aluminum nitride, aluminum nitride alloy, gallium nitride, zinc oxide, lithium tantalate, lithium niobate, lead zirconate titanate, and lead magnesium niobate-lead titanate.

19. The bulk acoustic wave resonance device according to claim 1, wherein the second layer comprises a piezoelectric layer comprising crystal grains and a crystal composed of crystal grains has a full width at half maximum of rocking curve less than 2.5 degrees.

20. The bulk acoustic wave resonance device according to claim 1, wherein a second portion of the second electrode layer overlapping with the first electrode layer is disposed above the first cavity, and a projection of the second portion along a direction perpendicular to the first layer falls within the first cavity.

21. The bulk acoustic wave resonance device according to claim 1, wherein the first electrode layer is made of one or more materials selected from a group consisting of molybdenum, ruthenium, tungsten, platinum, iridium and aluminum, and the second electrode layer is made of one or more materials selected from a group consisting of molybdenum, ruthenium, tungsten, platinum, iridium and aluminum.

22. The bulk acoustic wave resonance device according to claim 1, wherein the first electrode layer comprises a first polarity and the second electrode layer comprises a second polarity.

23. The bulk acoustic wave resonance device according to claim 1, wherein the first electrode layer comprises a first polarity and a second polarity, and the second electrode layer comprises the first polarity and the second polarity.

24. The bulk acoustic wave resonance device according to claim 1, further comprising a second substrate disposed at a second side of the first layer, wherein the second side is opposite to the first side.

25. The bulk acoustic wave resonance device according to claim 24, wherein the second substrate is made of one or more materials selected from a group consisting of silicon, silicon carbide and glass.

26. The bulk acoustic wave resonance device according to claim 24, further comprising a film disposed between the first layer and the second substrate.

27. The bulk acoustic wave resonance device according to claim 26, wherein the film comprises a polycrystalline film.

28. The bulk acoustic wave resonance device according to claim 27, wherein the polycrystalline film is made of one or more materials selected from a group consisting of polysilicon, polycrystalline silicon nitride, and polycrystalline silicon carbide.

29. A bulk acoustic wave filter device, comprising at least one bulk acoustic wave resonance device according to claim 1.

30. The bulk acoustic wave resonance device according to claim 7, wherein the support layer has a thickness ranging from 20 micrometers to 100 micrometers.

31. The bulk acoustic wave resonance device according to claim 30, wherein the support layer is made of one or more materials selected from a group consisting of polymer and insulating dielectric.

32. The bulk acoustic wave resonance device according to claim 31, wherein the polymer comprises at least one selected from a group consisting of benzocyclobutene, photosensitive epoxy resin photoresist, and polyimide.

33. The bulk acoustic wave resonance device according to claim 31, wherein the insulating dielectric comprises at least one selected from a group consisting of aluminum nitride, silicon dioxide, silicon nitride, and titanium oxide.

34. A radio frequency front end device, comprising a power amplification device and at least one bulk acoustic wave filter device according to claim 29, wherein the power amplification device is coupled with the bulk acoustic wave filter device.

35. A radio frequency front end device, comprising a low noise amplification device and at least one bulk acoustic wave filter device according to claim 29, wherein the low noise amplification device is coupled with the bulk acoustic wave filter device.

36. A radio frequency front end device, comprising a multiplexing device, wherein the multiplexing device comprises at least one bulk acoustic wave filter device according to claim 29.

* * * * *